United States Patent
Gupta et al.

(10) Patent No.: US 9,362,883 B2
(45) Date of Patent: Jun. 7, 2016

(54) PASSIVE RADIO FREQUENCY SIGNAL HANDLER

(71) Applicant: TDK Corporation, Tokyo (JP)

(72) Inventors: Dev V. Gupta, Concord, MA (US); Zhiguo Lai, Acton, MA (US)

(73) Assignee: TDK Corporation, Tokyo (JP)

( * ) Notice: Subject to any disclaimer, the term of this patent is extended or adjusted under 35 U.S.C. 154(b) by 101 days.

(21) Appl. No.: 14/195,478

(22) Filed: Mar. 3, 2014

(65) Prior Publication Data

US 2014/0266502 A1    Sep. 18, 2014

Related U.S. Application Data (60) Provisional application No. 61/779,518, filed on Mar. 13, 2013.

(51) Int. Cl.
*H01P 5/12* (2006.01)
*H03H 7/38* (2006.01)
*H03F 1/56* (2006.01)

(52) U.S. Cl.
CPC .. *H03H 7/38* (2013.01); *H01P 5/12* (2013.01); *H03F 1/565* (2013.01)

(58) Field of Classification Search
CPC .............. H03H 7/38; H01P 5/12; H03F 1/565
USPC ......................................................... 333/131
See application file for complete search history.

(56) References Cited

U.S. PATENT DOCUMENTS

| | | | |
|---|---|---|---|
| 6,587,013 B1 | 7/2003 | Arlin et al. | |
| 6,798,314 B2 * | 9/2004 | Nation | H01P 5/19 333/101 |
| 6,903,938 B2 | 6/2005 | Waffenschmidt | |
| 6,919,858 B2 * | 7/2005 | Rofougaran | H04B 1/18 343/700 MS |
| 7,459,986 B2 | 12/2008 | Miller | |

(Continued)

FOREIGN PATENT DOCUMENTS

| | | |
|---|---|---|
| EP | 1758200 A2 | 2/2007 |
| WO | WO 01/61780 A1 | 8/2001 |

(Continued)

OTHER PUBLICATIONS

International Search Report and Written Opinion of the International Searching Authority in counterpart International Appl. No. PCT/US2014/022343, dated Jun. 5, 2014, in 11 pages.

(Continued)

*Primary Examiner* — Robert Pascal
*Assistant Examiner* — Kimberly Glenn
(74) *Attorney, Agent, or Firm* — Nixon Peabody LLP (57) ABSTRACT

A multi-stage signal handling circuit. Operating as a combiner or splitter, first stage transformers match low input impedance at a first set of differential terminals, and second stage transformers match expected higher impedance at second terminal(s). Transformer windings are mirror image, vertically aligned, meandering conductive tracks disposed on opposite sides of a PCB. Air columns above or below the conductive tracks reduce ground plane effects. A capacitor provided across the differential input terminals of each transformer is chosen to further match the power amplifier output, including consideration of inherent inductance presented by the circuit tracks and vias between transformer sections.

20 Claims, 11 Drawing Sheets

(56) References Cited

U.S. PATENT DOCUMENTS

| | | |
|---|---|---|
| 7,755,452 B2 | 7/2010 | Knickerbocker et al. |
| 8,093,959 B1 | 1/2012 | Apel |
| 8,350,642 B2 | 1/2013 | Jensen |
| 8,483,626 B2 | 7/2013 | Gupta |
| 2011/0051782 A1 | 3/2011 | Gupta et al. |

FOREIGN PATENT DOCUMENTS

| | | |
|---|---|---|
| WO | WO 2006/088605 A2 | 8/2006 |
| WO | WO 2007/030711 A2 | 3/2007 |
| WO | WO 2013/138457 A1 | 9/2013 |

OTHER PUBLICATIONS

Rivas, Mario, "CMOS is the wrong technology for 3G handset Pas," Design How-To EE Times, Feb. 18, 2010, http://www.eetimes.com/document.asp?doc_id=1276898, 3 pages.

Faradflex BC8M, BC12M, BC16M and BC24M— *Ultra Thin Advanced Electronic Materials*, Oak-Mitsui Technologies, Inc. Datasheet, Apr. 29, 2009, 2 pages.

* cited by examiner

PASSIVE RADIO FREQUENCY SIGNAL HANDLER

CROSS REFERENCE TO RELATED APPLICATION(S)

This application claims the benefit of the filing date of a co-pending U.S. Provisional Patent Application entitled "Passive Power Combiner Circuit", Ser. No. 61/779,518 filed Mar. 13, 2013, the entire contents of which are hereby incorporated by reference.

BACKGROUND

1. Technical Field

This application relates to signal handling circuits such as radio frequency (RF) combiners and/or splitters, and more particularly to such circuits operating with multiple low impedance signal sources such as power amplifiers, filters, and other RF circuits.

2. Background Information

There is an ever increasing demand for smaller and smaller electronic devices with improved performance and additional features. Smart phones, tablets, laptop computers, and devices are now invariably expected to communicate using may different types of wireless networks such as 3G, 4G, Long Term Evolution (LTE) and other cellular, Wireless Fidelity (Wi-Fi), Near Field Communication (NFC), Global Positioning System (GPS), Bluetooth and still other protocols. Numerous analog and mixed signal design challenges exist as a result of the need to accommodate the resulting ranges of operating frequencies and wide bandwidths. In addition, a "thin is in" requirement continues to reduce the space available for antennas and other radio frequency components needed to provide this connectivity.

Deep Sub-Micron and other Complimentary Metal Oxide Semiconductor (DSM-CMOS) Integrated Circuit (IC) technologies are increasingly used to implement the mixed-signal front-ends needed in these systems. As some examples, U.S. Patent Publication 2011/0051782 by Gupta, et al., entitled "Method, System and Apparatus for Wideband Signal Processing" discusses tunable state variable filters implemented in CMOS that can be used as RF components. U.S. Pat. No. 8,483,626 by Gupta entitled "Software Defined Radio" describes a CMOS programmable front end circuit including a frequency synthesizer, up and down converter, and anti-aliasing filters, that can be programmed to adapt to different wireless technologies. Patent Cooperation Treaty (PCT) Publication 2013/138457 A1 by Gupta describes still further refinements of software-defined radio front ends including power amplifiers and an antenna matching network. Each of these patents and patent applications are assigned to the Newlans, Inc., and are hereby incorporated by reference in their entirety.

These CMOS-based solutions can operate over broad bandwidths and provide the required high density circuit integration. While this provides the dual advantage of high-frequency operation and reduced circuit area, the ability to handle the need for higher power is compromised, as a result of the lower voltage levels at which CMOS circuits operate.

Recent advancements in semiconductor technology have made power amplifiers implemented with gallium nitride (GaN) and/or gallium arsenide (GaAs) attractive for certain high-voltage, high-power applications. However integration of this type of amplifier is also not necessarily easy in every instance. They are not inherently wideband, and thus the required matching networks become complex.

Thus, although mixed signal front-ends remain at least one area where technologies such as GaAs and GaN might present an attractive solution, they too are not ideal. It would be preferable to use other more widely available technologies such as CMOS that integrate more easily with digital circuits. However, because CMOS-based amplifiers and other components typically operate at relatively lower voltage, they are not inherently able to handle as much power as corresponding GaAs or GaN amplifiers.

SUMMARY

It therefore becomes increasingly important to consider the design of the radio frequency circuits, such as filters and power amplifiers, in these applications. These circuits are typically designed to couple to the 50 ohms or higher impedance loads used in radio transmitters and antennas. Other requirements, such as power handling, also dictate that individual filters, power amplifiers, and other RF circuits are sometimes insufficient to meet system specifications. It would also be ideal if these RF front end components could be implemented in popular integrated circuit technologies, such as CMOS, while avoiding some of the shortcomings of low voltage operation.

To meet the desired power requirements, multiple CMOS components such as RF amplifiers or filters, can operate in parallel. With such a solution a need arises to combine and/or split the inputs and/or outputs of these individual RF components. However, introducing combiners and splitters can compromise other operational characteristics. For example, combiners and splitters may introduce impedance, bandwidth and operating voltage constraints.

What is needed is a way to efficiently combine or split the outputs from several RF circuits. A combiner solution should be able to match a preferred low impedance at multiple inputs, while combining these inputs to match an expected characteristic impedance of a typical transmit antenna or receiver, such as 50 ohms. The combiner thus should transform signals received from multiple low-impedance inputs to a combined high impedance output, should combine the inputs with low-loss and minimal reflection, should be wideband, and should be as small as possible.

If the circuit is formed from passive components, it may also function as a splitter. The splitter should be capable of taking a single high impedance input, dividing it into multiple low impedance outputs, and otherwise transforming the impedances in the same manner as the combiner.

A solution to these problems described herein is signal handling circuit implemented in two or more stages; each stage implements a different type of modified, multiple-input transformer such as a Guanella transformer circuit.

In the case of a signal combiner, the first type of modified Guanella transformer used in a first stage is designed to provide relatively low input impedance to match the output impedance of multiple input circuits, such as high-power amplifiers. The second type of Guanella transformer used in a second stage combines the outputs from multiple Guanella transformers in the first stage and also matches the expected input impedance of the output circuit, such as an antenna.

The Guanella transformers in each stage are formed on one or more substrates such as multilayer printed circuit boards (PCBs). For example, the inductive winding elements of each transformer section are implemented using PCB conductive tracks that meandered back and forth on a given PCB layer.

To further exhibit high coupling coefficient in the smallest possible area, the two windings that make up each transformer section are formed as mirror image, vertically aligned, conductive tracks on opposite side of the same PCB substrate.

The PCB substrate material may be FaradFlex™ available from Oak Mitsui Technologies of Hoosick Falls, N.Y., or other ultra-thin, laminated, low impedance, low inductance and high capacitance substrate. These ultra-thin substrates, having a resulting small thickness, allow implementing the conductive tracks with relatively low impedance for a given conductive line width. This in turns provides a further advantage in that the meander lines that implement each transformer winding may be narrower, and thus smaller, for a handing a signal of a given power level.

In still other aspects, some of the windings for the Guanella transformers in the first stage can be disposed on the same PCB surface as some of the windings of the Guanella transformers in the second stage. This further makes the assembly as small as possible.

In still other aspects, one or more air columns are provided above or below the conductive tracks that implement the windings of the transformer elements. Providing an air column over the printed circuit board introduces a low dielectric media, helping constrain electric fields to printed circuit board area, and reducing ground plane effects.

In still other aspects a capacitor is provided across the differential input terminals of each Guanella transformer section. The capacitance value is chosen to further match the power amplifier output, and consideration should also be given to the inherent inductance presented by the circuit tracks and vias between transformer sections.

In further aspects, the multilayer printed circuit board carrying the Guanella transformers may be suspended above a power amplifier chip by a spacer. The spacer provides open area for an air to be placed over the meandering lines, further improving performance.

The same circuit topology can be used to implement a splitter by reversing the functions of the input and output terminals. In this application, the circuit takes a single input signal, which may have a 50 ohm characteristic impedance, feeds that through the second stage Guanella transformers, to the first stage Guanella transformers, to multiple differential splitter outputs.

BRIEF DESCRIPTION OF THE DRAWINGS

The above and further advantages of the embodiments herein may be better understood by referring to the following description in conjunction with the accompanying drawings in which like reference numerals indicate identically or functionally similar elements, of which.

DESCRIPTION OF ILLUSTRATIVE EMBODIMENTS

Figure 1:
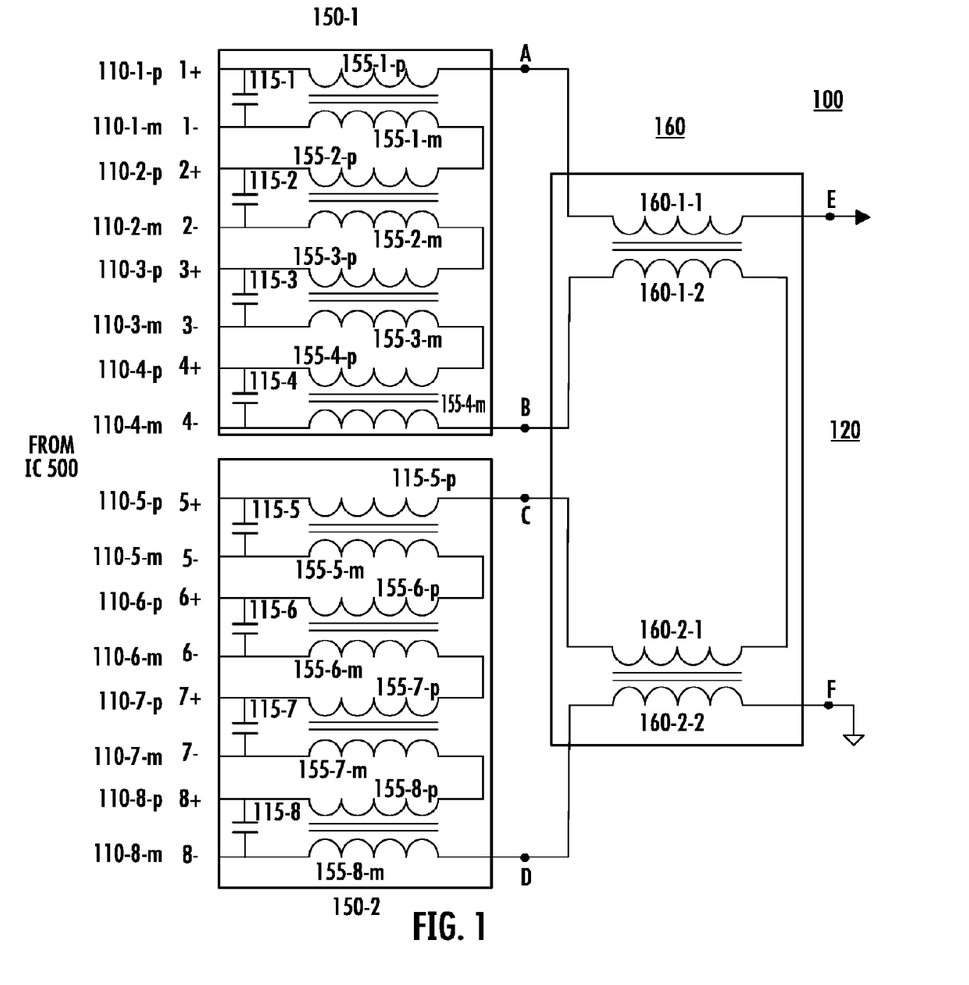
FIG. 1 is an overall electrical circuit diagram of a signal handler which may function as a combiner or splitter.

FIG. 1 a high-level circuit diagram of a signal handing apparatus 100 designed according to the teachings herein. This particular implementation is described as configured as a combiner 100 having eight (8) differential inputs at ports 110-1-$p$, 110-1-$m$, 110-2-$p$, . . . , 110-8-$m$ (also labeled as 1+, 1−, 2+, . . . , 8−). The port impedances may be relatively low such as 6.25 ohms each. The combiner 100 combines these 8 differential inputs at ports 110 to a single 50 ohm output at port 120. The design makes use of two transformer stages 150 and 160. In this embodiment each transformer stage includes one or more transformers that are a form of modified Guanella transformer.

It should be understood that since the apparatus is composed of passive circuit elements, it can also be used with RF signals flowing in the opposite direction (from right to left) as a splitter. In such an instance, the apparatus may accept signals at port 120 as a input (such as from an antenna) and provide 8 differential outputs at ports 110. Thus, although the discussion that follows will primarily consider the apparatus operating as a combiner, operation as a splitter is possible and analogous.

The first stage 150 includes two Guanella transformers 150-1, 150-2. A first Guanella transformer 150-1 is of a first type that combines four (4) differential inputs at ports 110-1-$p$, 110-1-$m$, . . . , 110-4-$m$ (1+, 1−, 2+, 2−, 3+, 3−, 4+, 4−) to generate a first differential output 158-1 between nodes labeled A and B. A second such "differential 4:1" Guanella transformer 150-2 is also of the first type and combines differential inputs (5+, 5−, 6+, 6−, 7+, 7−, 8+, 8−) providing a differential output 158-2 between nodes C and D.

A second type of modified Guanella transformer 160 is a 2:1 differential transformer that combines differential outputs A-B and C-D to generate a balanced output at nodes E and F. As shown in the FIG. 1, node F may be grounded to provide an unbalanced output. In any event the output impedance between nodes E and F is transformed to a desired output impedance such as 50 ohms needed to efficiently drive a transmit antenna.

As shown, each 4:1 Guanella transformer 150-1, 150-2 in the first stage consists of 4 sections, with each section including a pair of windings. For example, transformer 150-1 includes winding pairs 155-1-$p$, 155-1-$m$; 155-2-$p$, 155-2-$m$; 155-3-$p$, 155-3-$m$; and 155-4-$p$, 155-4-$m$. Similarly, Guanella transformer 150-2 includes winding pairs 155-5-$p$, 155-5-$m$; 155-6-$p$, 155-6-$m$; 155-7-$p$, 155-7-$m$; and 155-8-$p$, 155-8-$m$.

The turns ratio for the Guanella transformer sections may be selected as in a standard impedance matching transformer design. As explained in more detail below, however additional reactance provided from the longer conductive line lengths between sections and vias of the PCBs should be taken into account. This impedance matching can be further accommodated by including a capacitor-1, . . . 115-8 within each transformer section disposed each respective pair of differential inputs.

Figure 2:
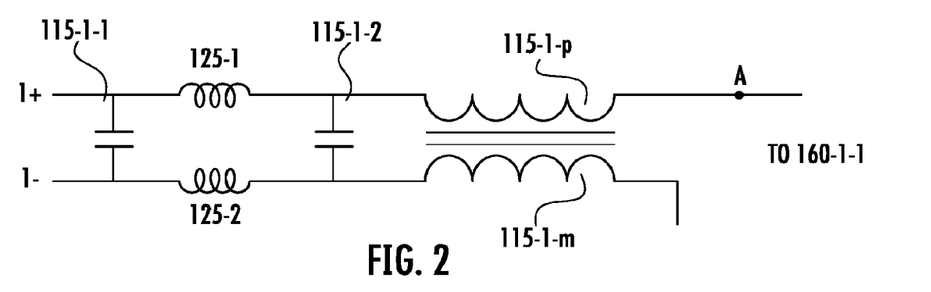
FIG. 2 is an equivalent circuit for the input terminals of one example Guanella transformer section.

FIG. 2 shows this in more detail. The impedance value of example capacitor(s) 115-1-1, 115-1-2 are chosen to match the corresponding differential output impedance of the power amplifier that provides input signals 1+, 1−. However, also taken into account here are the parasitic impedances 125-1, 125-2 introduced into the circuit by the printed circuit board lines and conductive vias used to connect the input terminals to the windings 155-1-$p$, 155-1-$m$. Thus parasitic impedances 125-1, 125-2 are taken into account when determining the capacitance for 115-1-1 and 115-1-2, which may be 10 pF in one embodiment.

Figure 3:
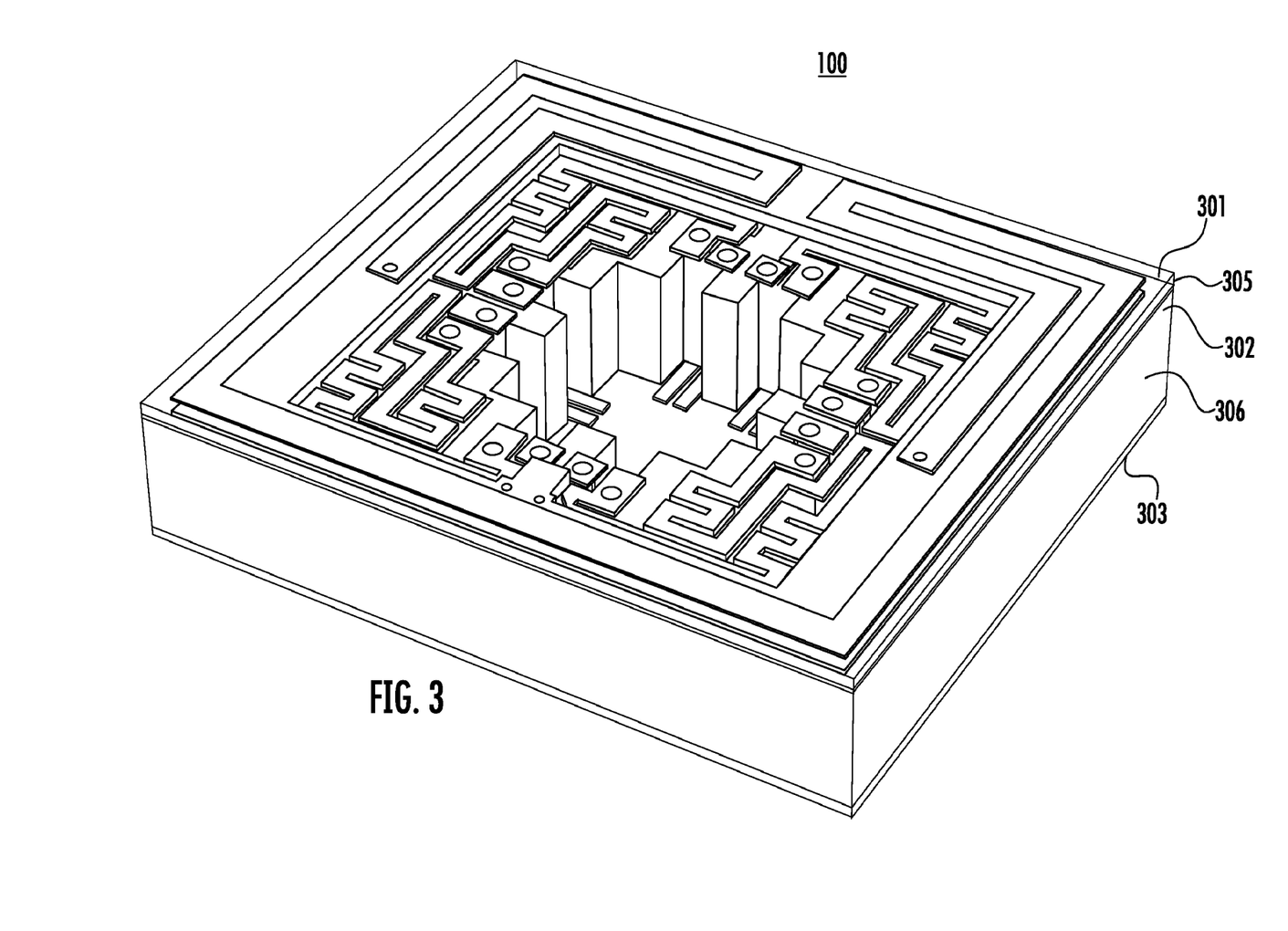
FIG. 3 is a three-dimensional isometric view of a combiner assembly showing the printed circuit boards within.
Figure 4:
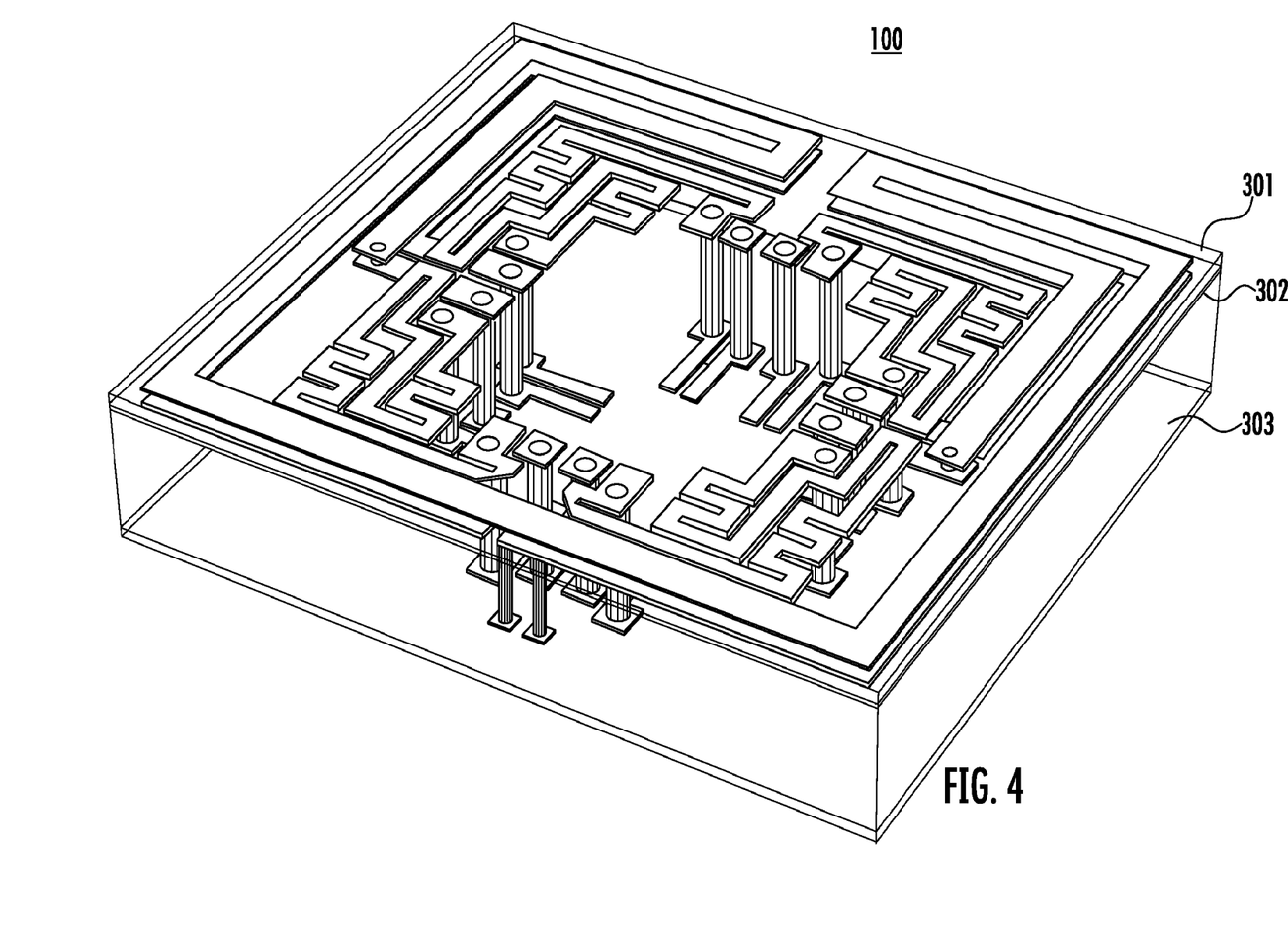
FIG. 4 is a similar three-dimensional view with spacers removed.
Figure 5:
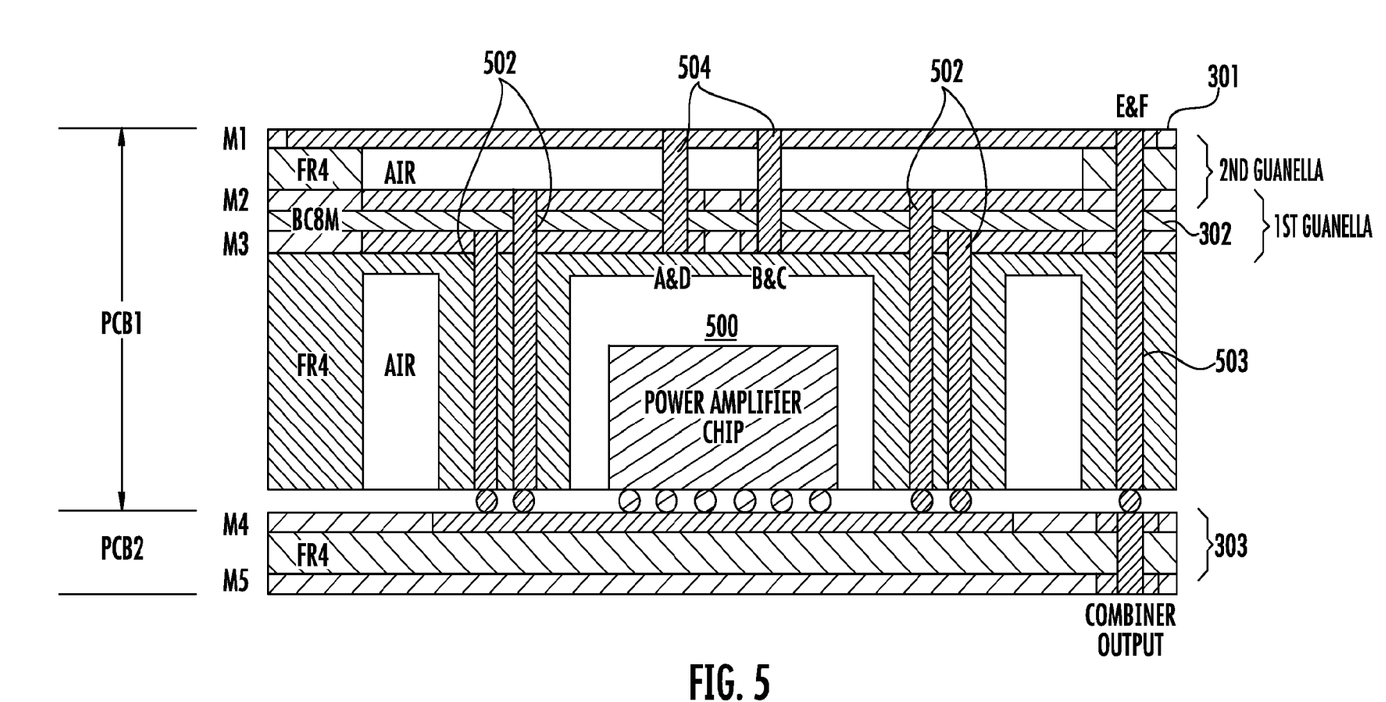
FIG. 5 is a cross-sectional view of the assembly.

FIGS. 3 and 4 are a three-dimensional view, and FIG. 5 a cross-sectional view, of a structural assembly 300 for one possible implementation of the power combiner 100. The power combiner assembly 300 generally consists of a first printed circuit board 301 having at least one metal layer M1, a second printed circuit board 302 having two metal layers M2 and M3, and a third printed circuit board 303 having two metal layers M4 and M5. An upper spacer 305 is disposed between printed circuit boards 301 and 302 and a lower spacer 306 is placed between printed circuit boards 302 and 303.

The first 301 and second 302 printed circuit boards and associated spacers 305, 306 can be assembled as a first printed circuit board sub-assembly PCB1; the second printed circuit board can be assembled as a second sub-assembly PCB2.

As shown and described in detail later in connection with other figures, the first printed circuit board 301 carries a portion of the second stage Guanella transformers 160, a top layer of the second printed circuit board 302 carries portions of both the first stage 150 and second 160 stage Guanella transformers, and a bottom layer of the second printed circuit board carries other portions of the first stage of Guanella transformers 150.

FIG. 4 is a three dimensional view similar to FIG. 3 but with the spacers 305, 306 removed so that the printed circuit board layers can be seen more readily.

FIG. 5 is a cross-sectional view of the same power combiner assembly 300. This view shows the relative arrangement of the printed circuit boards 301, 302, 303, their corresponding metal layers M1, M2, M3, M4 and M5, and spacers 305, 306.

The printed circuit boards carry the five aforementioned metal layers as follows. A bottom surface of printed circuit board 301 carries metal layer M1, printed circuit board 302 carries metal layer M2 on the top surface and metal layer M3 on a bottom surface, and printed circuit board 303 carries metal layer M4 on a top surface and metal layer M5 on a lower surface.

Printed circuit boards 301 and 303 may be composed of any convenient printed circuit board material such as FR4 or other resin based substrate. Printed circuit board 302 however is preferably formed from an inner FaradFlex™ BC8M layer sandwiched in between an upper and lower layer of FR4. In the illustrated embodiment the BC8M layer may be 0.315 mils thick and the FR4 may be 2 mils. This thin PCB material allows the printed circuit traces implementing windings 155 to be as thin as possible-.

Printed circuit board layer 303 (PCB2) has a primary purpose of supporting a power amplifier chip 500. In this embodiment power amplifier chip includes eight power amplifiers. The differential outputs from the 8 power amplifiers are connected up to the rest of the assembly 300 using vias 502. Specifically, interconnections are provided from the power amplifiers to both the metal layer M2 and M3 of printed circuit board 302. Vias 510 provide a return signal path to the combiner output terminals 320 on board 303. Additional vias 504 are provided between circuit board 302 up to circuit board 301 to interconnect various elements of the Guanella transformers as explained in greater detail below.

As visible in FIGS. 3 and 4, the windings (e.g., 155-4-$p$) that make up the various Guanella transformer sections are implemented as meandering conductive circuit board tracks or traces. These meandering lines are disposed in such a way to provide broadside coupling to achieve as high a coupling coefficient in as small an area as possible. More specifically, the two windings that make up each transformer section are formed as mirror image, vertically aligned, conductive tracks on opposite sides of the same PCB. For example, returning attention back to FIG. 1, the meandering line 155-1-$p$ is disposed on a PCB side opposite the side on which the meandering line 155-1-$m$ is placed.

In addition, it is preferred that the meander lines connected to adjacent Guanella transformer sections are placed on the same side of the same printed circuit board layer wherever possible. So for example the meandering line implementing winding 155-1-$m$ is placed on the same printed circuit board layer as the meander line implementing winding 155-2-$p$. This also permits the capacitors 115 to be disposed at convenient locations near the vias between layers.

The BC8M circuit board material thus also serves as a dielectric for the first stage of Guanella transformers. The top spacer 306 serves as a dielectric for the second stage of Guanella transformers.

In still other aspects, the spacers 305, 306 provide one or more air columns above and/or below the conductive tracks that implement the windings 155 of the various transformer elements. Providing an air column both above and below the printed circuit board introduces a low dielectric media (air) helping constrain electric fields in the transformer structures to the printed circuit board area. This reduces any ground plane effects that might be introduced by a ground plane associated with PCB2 (not shown) or other surrounding metallic surfaces such as enclosures or shields (also not shown). In one embodiment, spacer 306 may be 24 mils thick, and spacer 305 somewhat smaller. The larger space defined by spacer 305 is used to accommodate the height of the power amplifier chip 500 as well as to define the air column above windings 155.

Figure 6:
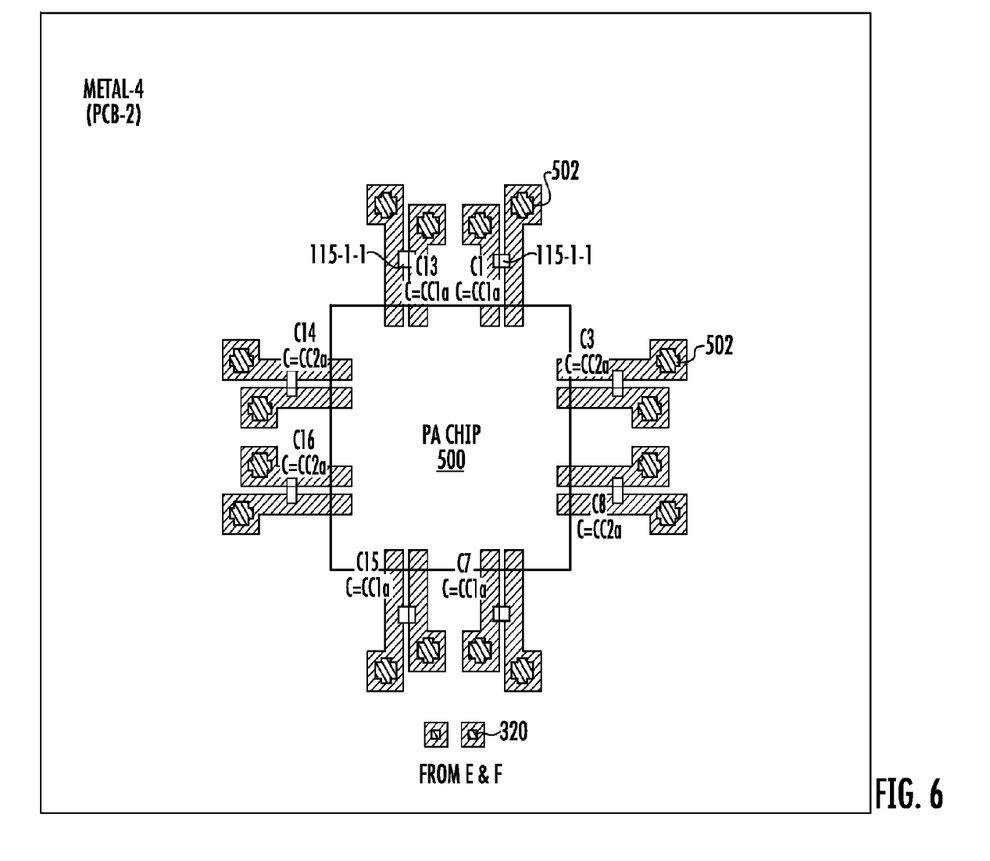
FIG. 6 is a plan view of a PCB metal layer number 4.

FIG. 6 is a plan view of metal layer M4 disposed on printed circuit board 303. This layer provides 16 connections from the eight (8) differential power amplifiers within chip 500. As illustrated these output terminals are coupled to respective vias that carry the power amplifier outputs up to layers of the printed circuit board 302. As can also be seen coupling capacitors 115-1-1 may also be disposed on this printed circuit board near where the power amplifier inputs enter the board.

Layer M4 also couples to vias 510 that provide the differential output signal terminals E and F as the combiner outputs 320.

Figure 7:
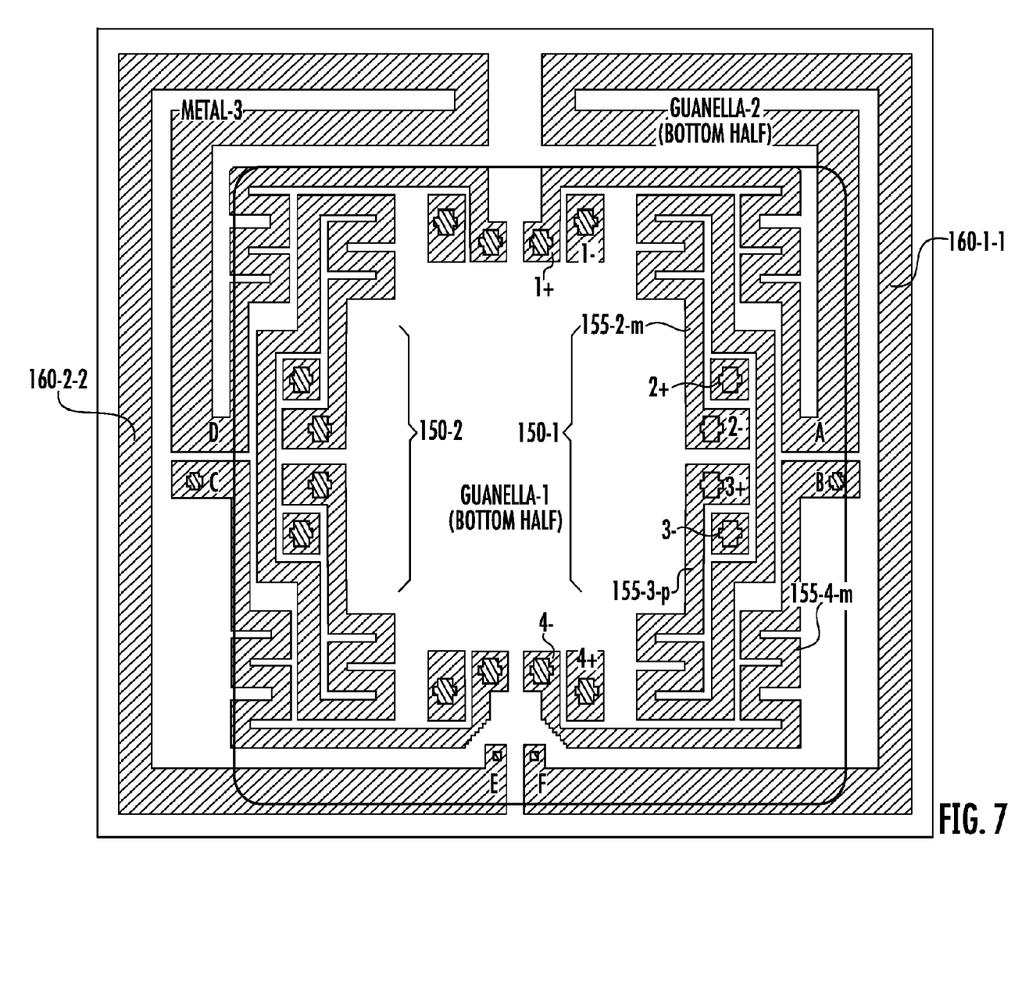
FIG. 7 is a plan view of metal layer number 3.

FIG. 7 is a plan view of metal layer M3 that is the bottom side of printed circuit board 302. Layer M3 serves to implement a bottom half of the first stage of Guanella transformers as well as a bottom half of the second stage of Guanella transformers. As shown on the right hand side of the figure, vias 502 carry signals up from the power amplifier connections on M4. Representative vias 502 for first stage Guanella transformer 150-1 are labeled as 1+, 1−, 2+, 2−, 3+, 3−, 4+, and 4−. Windings 155-1-$p$, 155-2-$m$, 155-3-$p$, and 155-4-$m$ are also shown. Implementation of one-half of first stage Guanella transformer 150-2 is similarly shown on the left hand side of the figure.

Layer M3 also provides reference nodes A, B, C and D as output from the first stage of Guanella transformers as well as output nodes E and F.

The bottom half of Guanella transformers 160-1, 160-2 are also implemented on M3—for example, windings 160-1-1 and 160-2-2 are located outboard of the first stage sections 155.

Figure 8:
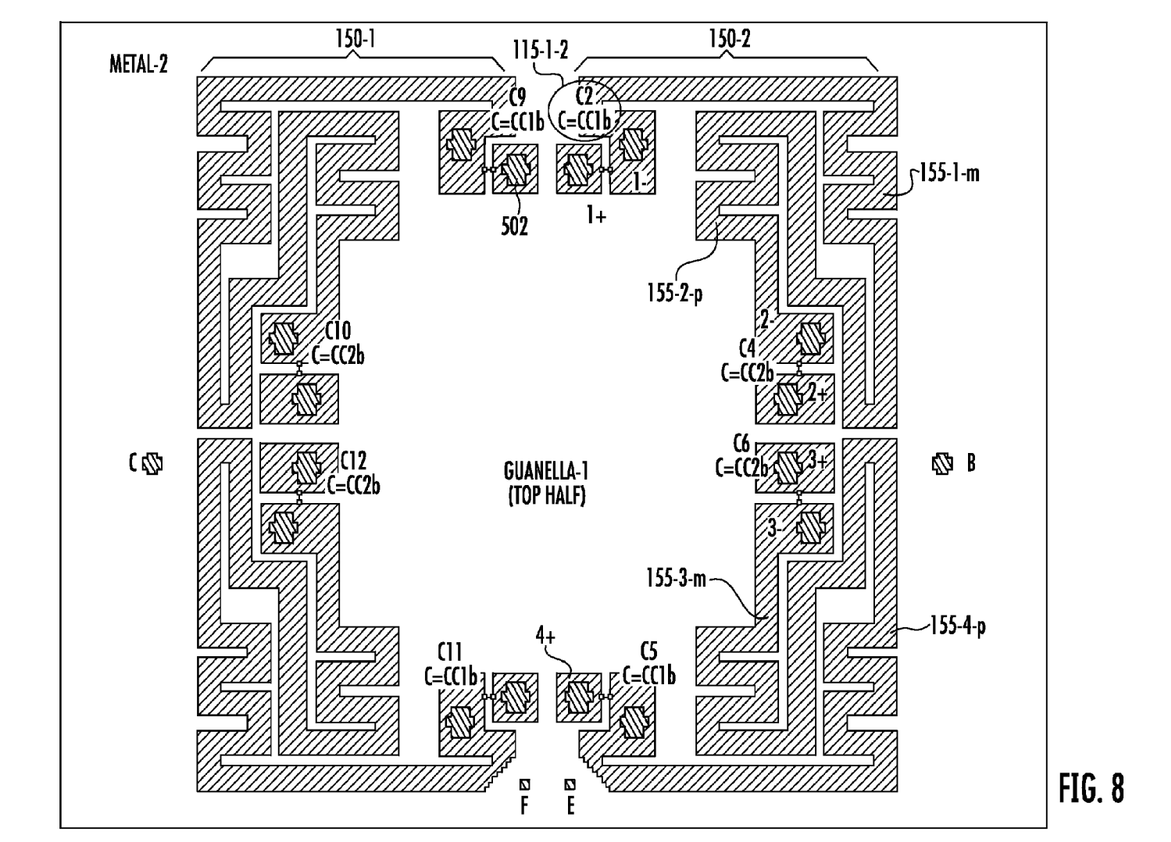
FIG. 8 is a plan view of a metal layer number 2.

FIG. 8 shows metal layer M2 which may be disposed on a top layer of printed circuit board 303. It is used to implement a top half of the Guanella transformers 150 in the first stage. Windings 155-1-$m$, 155-2-$p$, 155-3-$m$, and 155-4-$p$ that are part of Guanella transformer 150-1 are shown as well as vias 502 providing connections to power amplifier terminals 1+, 1−, 2+, 2−, 3+, 3−, and 4+, 4−. The corresponding portion of Guanella transformer 150-2 is disposed on the left hand side.

Matching capacitors such as 115-1-2, 115-2-2, etc. may be disposed in this layer.

Figure 9:
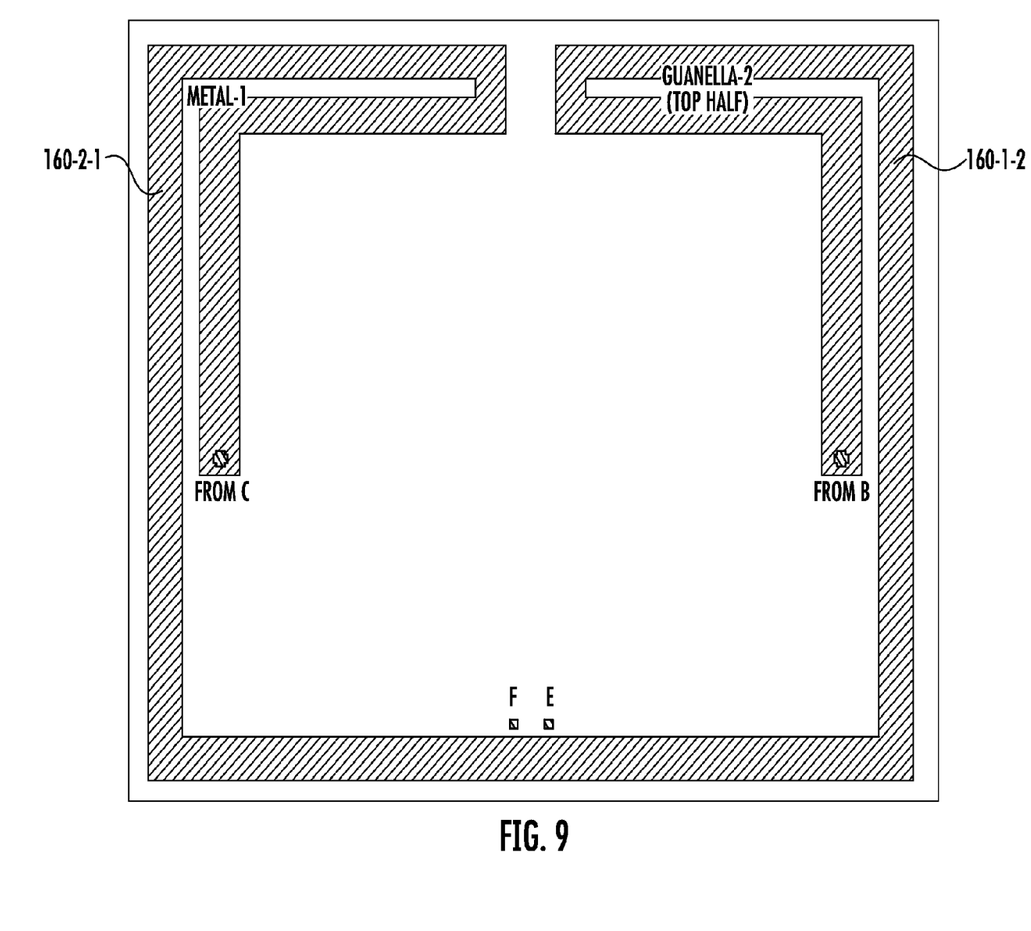
FIG. 9 is a plan view of a metal layer number 1.

FIG. 9 illustrates metal layer M1 disposed on substrate 301. This layer further defines portions of the second stage Guanella transformers 160-1, 160-2. Windings 160-1-2, 160-2-1 are placed in this layer.

Here again the same layout principles are observed with the coils of a given Guanella transformer section being disposed on opposite sides of a substrate, and with the coils of one Guanella transformer that connects to a neighboring Guanella transformer being disposed on the same printed circuit board layer.

Figure 10:
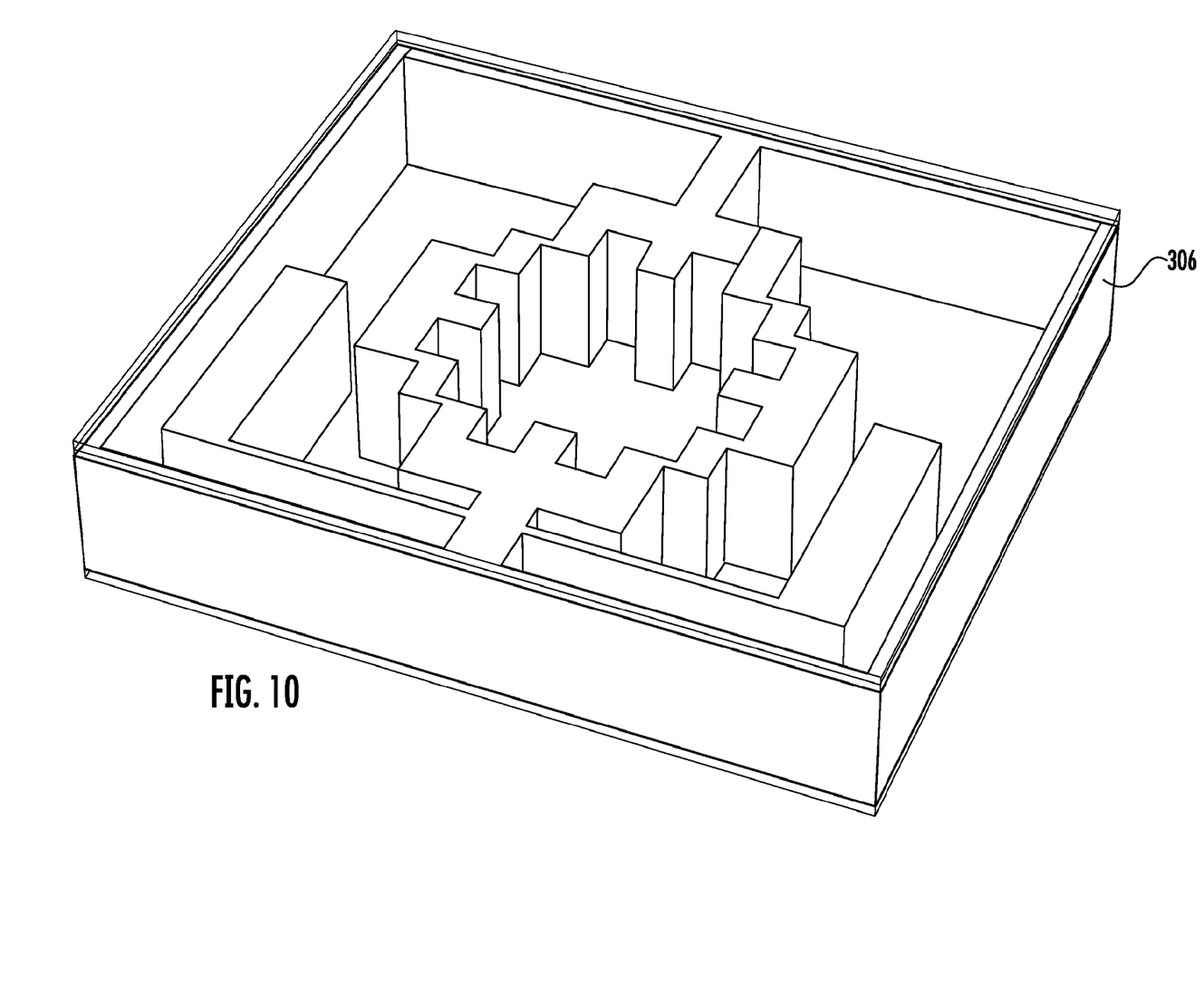
FIG. 10 is a three-dimensional view of a bottom spacer.

FIG. 10 illustrates the spacer 306 in more detail. As is seen it provides spaces to implement air gaps as described above.

Figure 11:
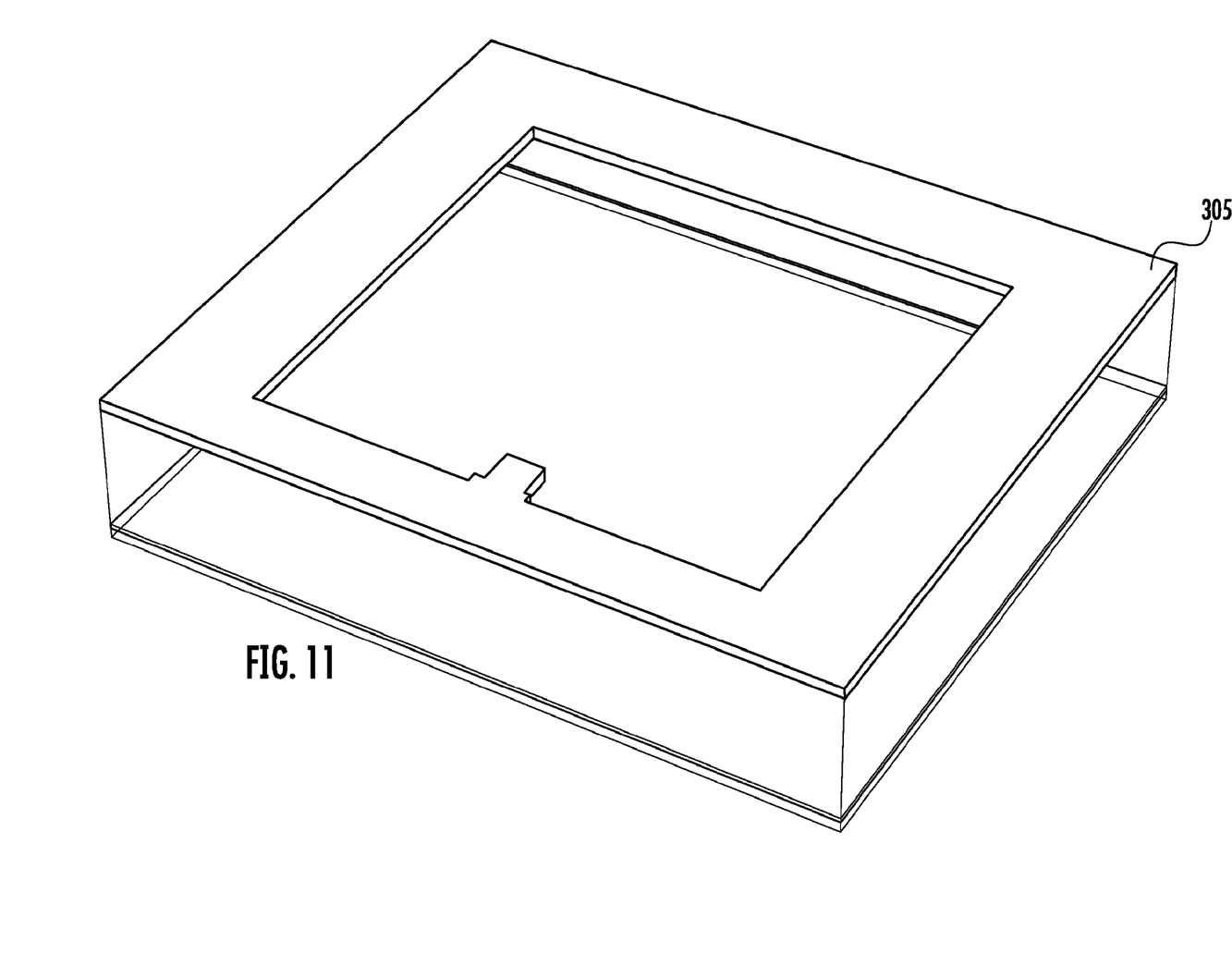
FIG. 11 is a three-dimensional view of a top spacer.

FIG. 11 is a plan view of top spacer 305.

Although not shown, an RF shield may surround the assembly 100. Any such shield should be placed such that air gap exists above the top metal layer M1, to again minimize coupling to grounded surfaces. For an assembly 300 which is approximately 0.469×0.415×0.030 inches in size, such a shield can be placed 0.33 inches or farther above top layer M1.

It can now be appreciated that:

The inductive winding elements of each transformer section are implemented using conductive tracks that meander back and forth on a given substrate layer. To further exhibit high coupling coefficient in the smallest possible area, the two windings that make up each transformer section are formed as mirror image, vertically aligned, conductive tracks on opposite side of the same substrate.

Broadside coupling provided between the windings of each Guanella transformer section provide higher coupling coefficient.

The use of ultra-thin, low impedance material as a substrate, such as BC8M printed circuit board material, provides for implementing the first stage transformers with low impedance conductive tracks. As a result, a given conductive meandering line width can handle a greater amount of power.

The resulting smaller line widths provide the ability to achieve compact size of the assembly 300.

In addition, disposing an air column over and within the printed circuit board subassembly reduces losses and improves efficiency by helping to constrain electric fields to the location near the meandering line windings.

Capacitors added across the differential inputs to the first stage Guanella transformers can accurately match the power amplifier output impedance to the first Guanella transformer input impedance.

What is claimed is:

1. A signal handling apparatus comprising:
a first stage including one or more impedance transformers of a first type, for receiving one or more differential input signals from a signal source, matching an input impedance of the apparatus to an output impedance of the signal source, and combining the one or more differential input signals as first stage differential outputs;
a second stage including one or more impedance transformers of a second type, for receiving the first stage differential outputs, combining the first stage differential outputs as a second stage output, and matching an impedance of the second stage output to an output device; and
wherein the impedance transformers of the first and second stage are each implemented using meandering line conductive traces disposed on a substrate,
wherein the impedance transformers of the second type are implemented as mirror image, vertically aligned, conductive traces disposed on opposite sides of a first substrate.

2. The apparatus of claim 1 wherein the impedance transformers of the first type are implemented as mirror image, vertically aligned, conductive traces disposed on opposite sides of the substrate.

3. The apparatus of claim 1, wherein the impedance transformers of the first type are partially implemented on one of the sides of the first substrate, and partially implemented on one of the sides of a second substrate.

4. The apparatus of claim 1 wherein each impedance transformer comprises two or more transformer sections, each of the sections associated with one of the differential inputs, and with each of the sections including a pair of meandering lines.

5. The apparatus of claim 4 wherein each of the transformer sections includes a capacitor disposed across the differential inputs.

6. The apparatus of claim 1 wherein the one or more impedance transformers of the first type comprises at least two impedance transformers of the first type.

7. The apparatus of claim 6 wherein each of the at least two impedance transformers of the first type includes windings implemented as minor image, meandering line, conductive traces on opposite sides of the substrate.

8. The apparatus of claim 1 wherein the signal source comprises a power amplifier integrated circuit.

9. The apparatus of claim 8 wherein the power amplifier integrated circuit comprises eight power amplifiers.

10. A signal handling apparatus comprising:
a first stage including one or more impedance transformers of a first type, for receiving one or more differential input signals from a signal source, matching an input impedance of the apparatus to an output impedance of the signal source, and combining the one or more differential input signals as first stage differential outputs;
a second stage including one or more impedance transformers of a second type, for receiving the first stage differential outputs, combining the first stage differential outputs as a second stage output, and matching an impedance of the second stage output to an output device; and
wherein the impedance transformers of the first and second stage are each implemented using meandering line conductive traces disposed on a substrate,
wherein the substrate is a FaradFlex material or any other ultra-thin material.

11. The apparatus of claim 10 wherein the one or more impedance transformers of the first type comprises at least two impedance transformers of the first type.

12. The apparatus of claim 11 wherein each of the at least two impedance transformers of the first type includes windings implemented as minor image, meandering line, conductive traces on opposite sides of the substrate.

13. The apparatus of claim 10 wherein the signal source comprises a power amplifier integrated circuit.

14. A signal handling apparatus comprising:
a first stage including one or more impedance transformers of a first type, for receiving one or more differential input signals from a signal source, matching an input impedance of the apparatus to an output impedance of the signal source, and combining the one or more differential input signals as first stage differential outputs;
a second stage including one or more impedance transformers of a second type, for receiving the first stage differential outputs, combining the first stage differential outputs as a second stage output, and matching an impedance of the second stage output to an output device, wherein the impedance transformers of the first and second stage are each implemented using meandering line conductive traces disposed on a substrate;

a spacer disposed adjacent the substrate;

and a second substrate, disposed on an opposite side of the spacer; and the spacer further defining one or more air columns located over or under the meandering lines.

15. The apparatus of claim 14 additionally comprising:
a power amplifier integrated circuit, disposed on the second substrate, providing the differential input signals.

16. The apparatus of claim 14 wherein the one or more impedance transformers of the first type comprises at least two impedance transformers of the first type.

17. The apparatus of claim 16 wherein each of the at least two impedance transformers of the first type includes windings implemented as minor image, meandering line, conductive traces on opposite sides of the substrate.

18. The apparatus of claim 14 wherein the signal source comprises a power amplifier integrated circuit.

19. A signal handling apparatus comprising:
a first group of impedance transformers of a first type, for coupling between a plurality of first differential signal ports and a first pair of differential internal nodes, and for matching an impedance of the differential signal ports to an impedance of the differential internal nodes;

a second group of one or more impedance transformers of a second type, for coupling between the differential internal nodes and a second signal port, and for matching an impedance of the differential internal nodes to the second port; and wherein the impedance transformers of the first and second groups are each implemented using meandering line conductive traces disposed on a substrate, wherein the apparatus is arranged as a signal splitter such that the second signal port is a splitter input port, and the first plurality of signal ports are differential splitter output ports.

20. The apparatus of claim 19 wherein the impedance transformers of the first and second type are each implemented using a plurality of mirror image, vertically aligned, inductive conductive traces disposed on opposite sides of the substrate.

* * * * *